US009929308B2

(12) United States Patent
Hsieh et al.

(10) Patent No.: US 9,929,308 B2
(45) Date of Patent: Mar. 27, 2018

(54) NITRIDE LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Hsiang-pin Hsieh, Xiamen (CN); Changwei Song, Xiamen (CN); Chia-hung Chang, Xiamen (CN); Chan-chan Ling, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/649,613

(22) Filed: Jul. 13, 2017

(65) Prior Publication Data

US 2017/0309773 A1 Oct. 26, 2017

Related U.S. Application Data

(63) Continuation of application No. PCT/CN2016/077836, filed on Mar. 30, 2016.

(30) Foreign Application Priority Data

Apr. 15, 2015 (CN) .......................... 2015 1 0174719

(51) Int. Cl.
H01L 33/12 (2010.01)
H01L 33/00 (2010.01)
(Continued)

(52) U.S. Cl.
CPC ............ H01L 33/007 (2013.01); H01L 33/06 (2013.01); H01L 33/12 (2013.01); H01L 33/32 (2013.01);
(Continued)

(58) Field of Classification Search
CPC ................. H01L 33/0066; H01L 33/30; H01L 21/02145; H01L 21/02178; H01L 21/022
(Continued)

(56) References Cited

U.S. PATENT DOCUMENTS

2014/0011013 A1* 1/2014 Jin ........................... B05D 5/08
428/297.4
2015/0069407 A1* 3/2015 Matsubayashi ... H01L 29/66462
257/76

(Continued)

FOREIGN PATENT DOCUMENTS

CN 1747185 A 3/2006

*Primary Examiner* — George Fourson, III
(74) *Attorney, Agent, or Firm* — Syncoda LLC; Feng Ma; Junjie Feng

(57) ABSTRACT

A nitride light-emitting diode (LED) fabrication method includes: providing a glass substrate; stacking a buffer layer structure composed of circular SiAlN layers and AlGaN layers with the number of cycles 1-5; growing a non-doped GaN layer, an N-type layer, a quantum well layer and a P-type layer. By using the low-cost glass the substrate that has a mature processing technology, and growing a SiAlN and an AlGaN buffer layer thereon, lattice mismatch constant between the substance and the epitaxial layer can be improved. Therefore, photoelectric property of the LED can be improved.

20 Claims, 2 Drawing Sheets

(51) Int. Cl.
*H01L 33/06* (2010.01)
*H01L 33/32* (2010.01)
*H01L 21/02* (2006.01)
*H01L 33/30* (2010.01)

(52) U.S. Cl.
CPC ...... *H01L 21/022* (2013.01); *H01L 21/02145* (2013.01); *H01L 21/02178* (2013.01); *H01L 33/0066* (2013.01); *H01L 33/30* (2013.01)

(58) Field of Classification Search
USPC ..................................... 257/94, 103; 438/38
See application file for complete search history.

(56) References Cited

U.S. PATENT DOCUMENTS

| | | | | |
|---|---|---|---|---|
| 2015/0236101 A1* | 8/2015 | Chiang | ............... | H01L 29/2003 257/194 |
| 2015/0311470 A1* | 10/2015 | Guimard | ............. | C03C 17/3644 257/40 |

* cited by examiner

NITRIDE LIGHT EMITTING DIODE AND FABRICATION METHOD THEREOF

CROSS-REFERENCE TO RELATED APPLICATIONS

The present application is a continuation of, and claims priority to, PCT/CN2016/077836 filed on Mar. 30, 2016, which claims priority to Chinese Patent Application No. 201510174719.1 filed on Apr. 15, 2015. The disclosures of these applications are hereby incorporated by reference in their entirety.

BACKGROUND

Light-emitting diode (LED) is a solid-state semiconductor light-emitting device, which is widely applied in luminous fields like indicator light and display screen.

At present, LED wafers are mainly produced via metal-organic chemical vapor deposition (MOCVD). The process is briefly introduced as below: put the substrate (today, mass-produced substrates mainly include sapphire substrate/Si substrate/SiC substrate) on the pocket profile of the graphite wafer carrier and transfer the substrate and the graphite wafer carrier to the MOCVD reaction chamber. Raise temperature of the reaction chamber to the set temperature, and feed meta-organic compound and Group V gas to break chemical bonds and rejoin a LED epitaxial layer on the substrate.

In the manufacturing process of LED epitaxial wafers, high-quality GaN material is often fabricated via heteroepitaxy. It is very important to choose the right type of substrate as different substrates would directly affect the lattice qualify of the grown epitaxial layer. Consider the following factors when selecting a substrate: lattice constant match, match of thermal expansion coefficient and appropriate price; in addition, different substrates also result in process difference from epitaxy to subsequent LED chip manufacturing process.

Today, substrates available for mass production mainly include sapphire substrates, Si substrates and SiC substrates. However, these substrates are not cost effective and difficult for mass production. Though numerous effort have been made to optimize epitaxial growth and subsequent manufacturing process of LEDs, the fall in LED cost still remains slow, which greatly prevents LEDs from popularization. Therefore, it needs to seek for a mature design of low-cost substrate and an epitaxial bottom structure for supporting the substrate growth.

SUMMARY

One aspect of the present disclosure is to provide a nitride light-emitting diode (LED) structure, comprising: a non-doped GaN layer, an N-type layer, a quantum well layer and a P-type layer, wherein: the GaN light emitting diode structure also comprises a glass substrate and a buffer layer structure composed of a SiAlN layer and an AlGaN layer deposited thereon.

In some embodiments, the glass substrate is a patterned substrate or a non-patterned substrate.

In some embodiments, the SiAlN layer and the AlGaN layer of the buffer layer structure form a successively-stacked circular structure with the number of cycles 1-5. In some embodiments, the SiAlN layer is 15 Å-300 Å thick.

In some embodiments, the AlGaN layer is 15 Å-300 Å thick.

In another aspect, the present disclosure provides a fabrication method of nitride light emitting diode, including: providing a glass substrate; stacking a buffer layer structure composed of circular SiAlN layers and AlGaN layers with the number of cycles 1-5; growing a non-doped GaN layer, an N-type layer, a quantum well layer and a P-type layer.

In some embodiments, the glass substrate is a patterned substrate or a non-patterned substrate.

In some embodiments, growth temperature of the SiAlN layer is 500-1000° C. and pressure is 100 torr-500 torr.

In some embodiments, growth temperature of the AlGaN layer is 500-800° C. and pressure is 100 torr-500 torr.

In some embodiments, the SiAlN layer is formed via metal-organic chemical vapor deposition (MOCVD), physical vapor deposition (PVD) or chemical vapor deposition (CVD).

In some embodiments, the AlGaN layer is formed via metal-organic chemical vapor deposition (MOCVD), physical vapor deposition (PVD) or chemical vapor deposition (CVD).

In another aspect, a light-emitting system including a plurality of the nitride LEDs are provided. The system can be used for lighting, display, signage, etc.

Various embodiments of the present disclosure can have one or more of the following advantages: (1) the glass substrate features low price and mature process and can be manufactured into large-area finished products, resulting in low fabrication cost of GaN light emitting diode; (2) the glass substrate is easy to cleavage, which simplifies subsequent chip processing and further reduces cost; (3) a SiAlN layer is firstly grown on the glass substrate to reduce lattice mismatch between the substrate and the AlN crystal; and then an AlGaN layer is formed to reduce lattice mismatch between the SiAlN layer and the GaN epitaxial layer. This eliminates lattice defect of light emitting diodes and improves photoelectric property.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive.

Figure 1:
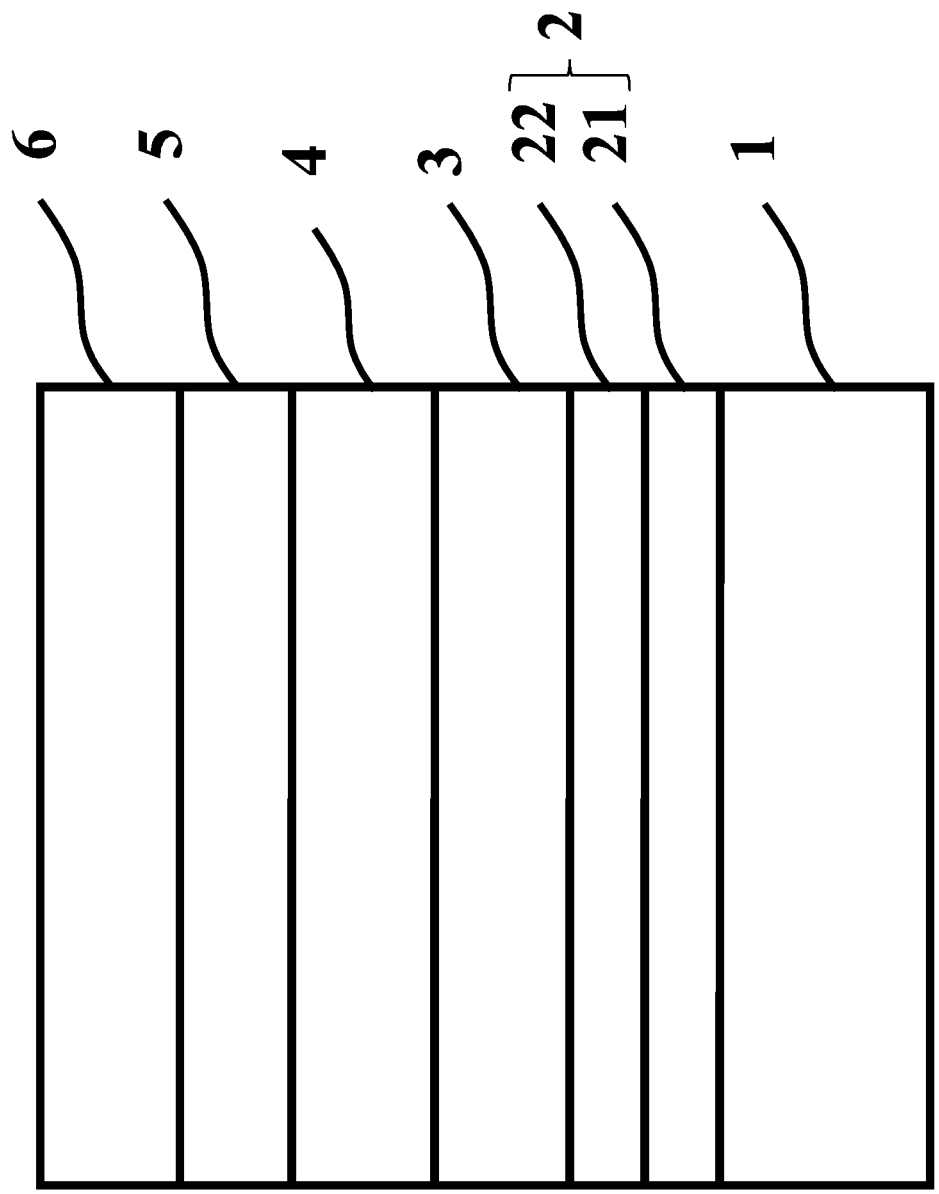
FIG. 1 is a structural diagram of a nitride light emitting diode in accordance with Embodiment 1 of the present disclosure.

In the drawings: 1: glass substrate; 2: buffer layer; 21: SiAlN layer; 22: AlGaN layer; 3: non-doped GaN layer; 4: N-type GaN layer; 5: quantum well layer; 6: P-type GaN layer.

DETAILED DESCRIPTION

The embodiments of the present disclosure will be described in detail with reference to the accompanying drawings and embodiments.

EXAMPLE 1

With reference to FIG. 1, provide a glass substrate 1, which is either a patterned substrate or a non-patterned substrate. This embodiment, a patterned glass substrate with high temperature resistance (above 1,300° C.) is preferred;

consecutively form a buffer layer 2 composed of a 15-300 Å SiAlN layer 21 and a 15-300 Å AlGaN layer 22, a non-doped GaN layer 3, an N-type GaN layer 4, a quantum well layer 5 and a P-type GaN layer 6 via MOCVD on the surface of the glass substrate 1, wherein, the dopant of the N-type GaN layer 4 is selected from at least one of C, Si, Ge, Sn, Pb, O, S, Se, Te, Po and the dopant of the P-type GaN layer 6 is selected from at least one of Be, Mg, Ca, Sr, and Ba.

Another aspect of the present disclosure is to provide a fabrication method for a nitride light emitting diode structure, comprising: providing a patterned glass substrate 1 with high temperature resistance (above 1,300° C.), and transferring it into the MOCVD reaction chamber. Due to large lattice mismatch and difference of thermal expansion coefficient between the glass substrate and the GaN material, it is impossible to obtain high lattice quality if a GaN layer is directly formed on the glass substrate; in addition, large stress of the formed semiconductor structure results in low quality and growth yield of subsequent devices. To solve this problem, in this method, a buffer layer 2 composed of a SiAlN layer 21 and an AlGaN layer 22 is firstly formed on the glass substrate 1.

The buffer layer 2 is formed by the following methods: at first, grow a 15-300 Å SiAlN layer 21 by changing temperature and pressure of the reaction chamber to 500-1,000° C. and 100 torr-500 torr respectively; then, grow a 15-300 Å AlGaN layer 22 on the surface of the SiAlN layer 21 by keeping the pressure constant and changing temperature to 500~800° C.; as thermal expansion coefficients of the glass substrate 1, the SiAlN layer 21, the AlGaN layer 22 and the GaN are $10\times10{-}6$ m/K, $8.21\times10{-}6$ m/K, $5.4\times10{-}6$ m/K, and $5.59\times10{-}6$ m/K, respectively, thermal expansion coefficients of the SiAlN layer 21 and the AlGaN layer 22 are configured to be successively lower till approximating to that of the GaN material. This effectively narrows difference in thermal expansion coefficient between the glass substrate and the GaN material, and directly improves abnormal wrapping of subsequently-fabricated semiconductor, thus effectively improving quality and production yield of light emitting diode.

In addition, as the glass substrate is a non-crystal material, having large mismatch with the subsequently-deposited GaN lattice, it is insufficiently to deposit a GaN semiconductor layer directly; however, the SiAlN layer 21 has Si elements and Al elements with adjustable contents, making the material characteristic of the SiAlN layer 21 between those of the glass substrate and the subsequent AlGaN layer 22 (lattice coefficient of SiAlN is 7.7-3.11); similarly, the AlGaN layer 22 has Al elements and Ga elements with adjustable contents, making the material characteristic of the AlGaN layer 22 between those of the SiAlN layer 21 and the GaN layer 3 (lattice coefficient of AlGaN is 3.11-3.189). In this way, with the SiAlN layer 21 and the AlGaN layer 22, the material characteristic difference between the glass substrate and GaN semiconductor layer are gradually reduced. This eliminates lattice defect of the finally-formed semiconductor element and improves quality and yield of the light emitting element.

Next, grow a non-doped GaN layer 3 and a Si-doped N-type GaN layer 4 by raising pressure of the reaction chamber to 150 torr-300 torr, and growth temperature to 900-1200° C.; grow a quantum well structure layer 5 by keeping the reaction chamber constant, and lowering temperature to 650-850° C.; and grow a Mg-doped GaN layer 6 by keeping pressure of the reaction chamber constant and raising temperature to 900-1,050° C.

EXAMPLE 2

Figure 2:
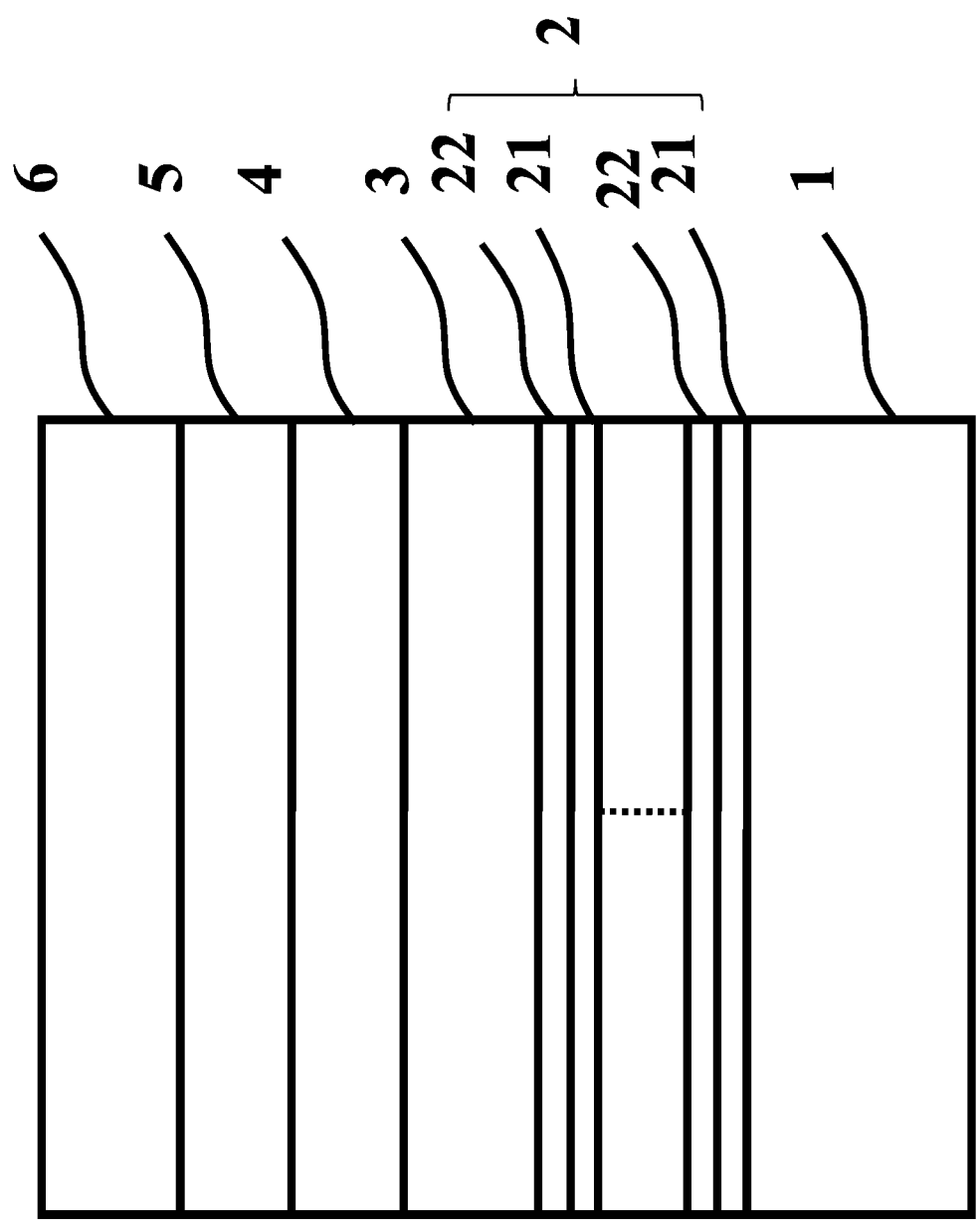
FIG. 2 is a structural diagram of a nitride light emitting diode in accordance with Embodiment 2 of the present disclosure.

Referring to FIG. 2, the difference between this embodiment and Embodiment 1 is that: the buffer layer 2 is a circular structure composed of 3 circles of SiAlN layer 21 and an AlGaN layer 22. The nitride light emitting diode in this embodiment is produced by the following process: (1) providing a patterned glass substrate with high temperature resistance; (2) depositing a SiAlN layer 21 on the substrate surface; (3) consecutively growing an AlGaN layer 22 on the SiAlN layer 21; (4) repeating steps (2) and (3) twice; (5) consecutively growing a non-doped GaN layer 3, an N-type GaN layer 4, a quantum well structure layer 5 and a P-type GaN layer 6 on the wafer surface after step (4) is completed.

As material characteristics of the SiAlN layer 21 and the AlGaN layer 22 in the buffer layer structure 2 successively approximate to that of the subsequent GaN semiconductor layer, and the stress buffer performance is improved after circular stack, this further reduces difference in material characteristics between the glass substrate and the subsequent GaN semiconductor layer, and the defects caused therefrom. In addition, this effectively reduces the stress between the glass substrate and the GaN semiconductor layer, and finally improves lattice quality and electrical performance of light emitting diodes.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride light-emitting diode (LED) structure comprising:
    a non-doped GaN layer;
    an N-type layer;
    a quantum well layer;
    a P-type layer;
    a glass substrate; and
    a buffer layer structure deposited over the glass substrate and comprising a SiAlN layer and an AlGaN layer.

2. The LED structure of claim 1, wherein the glass substrate is a patterned substrate or a non-patterned substrate.

3. The LED structure of claim 1, wherein: the AlGaN layer and the AlGaN layer of the buffer layer structure form a successively-stacked periodic structure with number of cycles of 1-5.

4. The LED structure of claim 1, wherein the SiAlN layer has a thickness of 15 Å-300 Å.

5. The LED structure of claim 1, wherein: the AlGaN layer has a thickness of 15 Å-300 Å.

6. A fabrication method of a nitride light-emitting diode (LED) structure, comprising:
    providing a glass substrate;

stacking a buffer layer structure comprising periodic SiAlN layers and AlGaN layers with number of cycles of 1-5;

growing a non-doped GaN layer, an N-type layer, a quantum well layer, and a P-type layer over the buffer layer structure;

wherein the nitride LED structure fabricated comprise:
the non-doped GaN layer;
the N-type layer;
the quantum well layer;
the P-type layer;
the glass substrate; and
the buffer layer structure deposited over the glass substrate and comprising the SiAlN and AlGaN layers.

7. The method of claim 6, wherein the SiAlN layers have a growth temperature of 500-1000° C. and a growth pressure of 100-500 torr.

8. The method of claim 6, wherein the AlGaN layers have a growth temperature of 500-800° C. and a growth pressure of 100-500 torr.

9. The method of claim 6, wherein the SiAlN layers are formed via metal-organic chemical vapor deposition (MOCVD), physical vapor deposition (PVD), or chemical vapor deposition (CVD).

10. The method of claim 6, wherein the AlGaN layers are formed via metal-organic chemical vapor deposition (MOCVD), physical vapor deposition (PVD) or chemical vapor deposition (CVD).

11. The method of claim 6, wherein dopant of the N-type layer comprises at least one of C, Si, Ge, Sn, Pb, O, S, Se, Te, or Po.

12. The method of claim 6, wherein dopant of the P-type layer comprises at least one of Be, Mg, Ca, Sr, or Ba.

13. The method of claim 6, configuring thermal expansion coefficients of the SiAlN layers and the AlGaN layers successively lower till approximating to a thermal expansion coefficient of the GaN material.

14. The method of claim 6, further comprising adjusting Si and Al contents in the SiAlN layers.

15. The method of claim 6, further comprising adjusting Al and Ga contents in the AlGaN layers.

16. A light-emitting system comprising a plurality of light-emitting diodes (LEDs), each LED comprising:
a non-doped GaN layer;
an N-type layer;
a quantum well layer;
a P-type layer;
a glass substrate; and
a buffer layer structure deposited over the glass substrate and comprising a SiAlN layer and an AlGaN layer.

17. The system of claim 16, wherein the glass substrate is a patterned substrate or a non-patterned substrate.

18. The system of claim 16, wherein the AlGaN layer and the AlGaN layer of the buffer layer structure form a successively-stacked periodic structure with number of cycles of 1-5.

19. The system of claim 16, wherein the SiAlN layer has a thickness of 15 Å-300 Å.

20. The system of claim 16, wherein the AlGaN layer has a thickness of 15 Å-300 Å.

* * * * *